US012575291B2

(12) United States Patent
Furuta et al.

(10) Patent No.: US 12,575,291 B2
(45) Date of Patent: Mar. 10, 2026

(54) ORGANIC LIGHT-EMITTING DEVICE, DISPLAY APPARATUS AND ELECTRONIC APPARATUS INCLUDING THE SAME

(71) Applicant: CANON KABUSHIKI KAISHA, Tokyo (JP)

(72) Inventors: Mariko Furuta, Kanagawa (JP); Yoshihisa Kawamura, Kanagawa (JP); Yuto Nozaki, Kanagawa (JP); Yuuki Kumagae, Kanagawa (JP); Kotaro Abukawa, Kanagawa (JP); Kunihito Ide, Kanagawa (JP); Jun Kamatani, Tokyo (JP); Satoru Shiobara, Kanagawa (JP); Nobuhiko Sato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 623 days.

(21) Appl. No.: 17/930,603

(22) Filed: Sep. 8, 2022

(65) Prior Publication Data

US 2023/0077028 A1     Mar. 9, 2023

(30) Foreign Application Priority Data

Sep. 9, 2021     (JP) ................................. 2021-146899

(51) Int. Cl.
*H01L 29/08*          (2006.01)
*H10K 50/858*        (2023.01)
(Continued)

(52) U.S. Cl.
CPC ........... *H10K 59/38* (2023.02); *H10K 50/858* (2023.02); *H10K 59/1213* (2023.02); *H10K 71/00* (2023.02)

(58) Field of Classification Search
CPC ...... H10K 59/38; H10K 50/858; H10K 71/00; H10K 59/1213
(Continued)

(56) References Cited

U.S. PATENT DOCUMENTS 5,368,976 A * 11/1994 Tajima .................. G03F 7/0007
430/196
2016/0065916 A1     3/2016 Ishioka
(Continued)

FOREIGN PATENT DOCUMENTS

CN          110114702 A * 8/2019 ............... G02B 5/20
EP          3787032 A2 * 3/2021 ........... H01L 37/322
(Continued)

OTHER PUBLICATIONS

Cite the machine translation Nakamura K (CN-110114702-A).*
(Continued)

*Primary Examiner* — Phuc T Dang
(74) *Attorney, Agent, or Firm* — Canon U.S.A., Inc., IP Division

(57)          ABSTRACT

The present disclosure relates to an organic light-emitting device including an insulating layer, an organic light-emitting element disposed on the main surface of the insulating layer, and a color filter layer covering the organic light-emitting element and including a first color filter that passes light with a first wavelength and a second color filter that passes light with a second wavelength different from the first wavelength, wherein the concentration of an organic alkali having a nitrogen atom and a hydroxy group contained in the color filter layer is less than 108.2 ng/cm$^2$.

16 Claims, 9 Drawing Sheets

(51) Int. Cl.

| | |
|---|---|
| H10K 59/121 | (2023.01) |
| H10K 59/38 | (2023.01) |
| H10K 71/00 | (2023.01) |

(58) Field of Classification Search
USPC .......................................................... 257/40
See application file for complete search history.

(56) References Cited

U.S. PATENT DOCUMENTS

| | | | |
|---|---|---|---|
| 2016/0093826 A1* | 3/2016 | Lee ........................ | H10K 71/00 |
| | | | 438/26 |
| 2018/0197921 A1* | 7/2018 | Kim .................... | H10K 50/865 |
| 2019/0305050 A1 | 10/2019 | Ishizuya | |
| 2021/0143352 A1 | 5/2021 | Yamazaki | |

FOREIGN PATENT DOCUMENTS

| | | | | |
|---|---|---|---|---|
| JP | 2003245617 A | | 9/2003 | |
| JP | 2013029832 A | * | 2/2013 | |
| JP | 2015007766 A | * | 1/2015 | .......... C08G 73/026 |
| JP | 2016051060 A | | 4/2016 | |
| JP | 2019153389 A | | 9/2019 | |
| JP | 2020 088065 A | | 6/2020 | |
| JP | 2020113494 A | | 7/2020 | |
| KR | 20140127136 A | | 11/2014 | |
| KR | 20190099759 A | * | 8/2019 | |
| KR | 20210098446 A | | 8/2021 | |
| WO | 2014175681 A1 | | 10/2014 | |
| WO | WO-2020111101 A1 | * | 6/2020 | ......... G02B 19/0014 |

OTHER PUBLICATIONS

Cite the machine translation Aoyanagi K (JP-2015007766-A).*
Cite the machine translation Lee Y (KR-20190099759-A).*
Cite the machine translation Suzuki T (WO-2020111101).*
Cite the machine translation Takashi T (EP-3787032).*
Cite the machine translation Nagai T (JP-2013029832-A).*

* cited by examiner 15
14
13
12
11
10

15a 15
14
13
12
11
10

15b  15a 15
14
13
12
11
10

15c  15b  15a

1000

1001

1002

1003

1004

1005

1006

1007

1008

1009

1300

1301    1302

1303

1310

1314

1312

1311

1313

ORGANIC LIGHT-EMITTING DEVICE, DISPLAY APPARATUS AND ELECTRONIC APPARATUS INCLUDING THE SAME

BACKGROUND OF THE INVENTION

Field of the Invention

The present disclosure relates to an organic light-emitting device, a display apparatus including the same, an electronic apparatus, and a method for manufacturing an organic light-emitting device.

Description of the Related Art

In recent years, an organic light-emitting display apparatus including an organic light-emitting element which is a spontaneous light-emitting device has attracted great amounts of attention as a flat panel display. The organic light-emitting element is a light-emitting element having an organic layer including a light-emitting layer. Regarding the organic light-emitting element, a type in which different colors are emitted in accordance with pixels and a type in which a white light is emitted and dispersed using a color filter are known.

Known color filters include on-glass color filters and on-chip color filters. Regarding the on-glass color filter, a color filter is formed on a substrate different from a substrate provided with an organic light-emitting element and, after the formation, bonded to the substrate provided with the organic light-emitting element. On the other hand, regarding the on-chip color filter, a color filter is formed on the provided organic light-emitting element.

Japanese Patent Laid-Open No. 2020-113494 describes a color filter formation step including a step of exposing a photosensitive resin and removing an unexposed portion of the resin layer by using an alkaline developing solution.

An organic light-emitting device described in Japanese Patent Laid-Open No. 2020-113494 is provided with an on-chip color filter.

However, since the organic light-emitting element has lower heat resistance than an element composed of an inorganic layer, formation is performed at a temperature lower than the condition for the inorganic layer. A developing solution which is decomposed at a high temperature during formation of the inorganic layer remains in the color filter formed at a low temperature. The reliability of the organic light-emitting device including the on-chip color filter in which such a component remains is deteriorated due to the component.

SUMMARY OF THE INVENTION

The present disclosure was realized in consideration of the above-described problems and provides an organic light-emitting device having high reliability due to a component contained in the developing solution being reduced.

The present disclosure provides an organic light-emitting device including an insulating layer, an organic light-emitting element disposed on the main surface of the insulating layer, and a color filter layer covering the organic light-emitting element and including a first color filter that passes light with a first wavelength and a second color filter that passes light with a second wavelength different from the first wavelength, wherein each of the first color filter and the second color filter has a first surface facing the organic light-emitting element and a second surface opposite to the first surface, a difference between the distance from the first surface of the first color filter to the insulating layer in the direction perpendicular to the main surface of the insulating layer and the distance from the first surface of the second color filter to the insulating layer in the direction perpendicular to the main surface of the insulating layer is smaller than a difference between the distance from the second surface of the first color filter to the insulating layer in the direction perpendicular to the main surface of the insulating layer and the distance from the second surface of the second color filter to the insulating layer in the direction perpendicular to the main surface of the insulating layer, and the concentration of an organic alkali having a nitrogen atom and a hydroxy group contained in the color filter layer is less than 108.2 ng/cm$^2$.

Further features of the present disclosure will become apparent from the following description of exemplary embodiments with reference to the attached drawings.

DESCRIPTION OF THE EMBODIMENTS

Figure 1A:
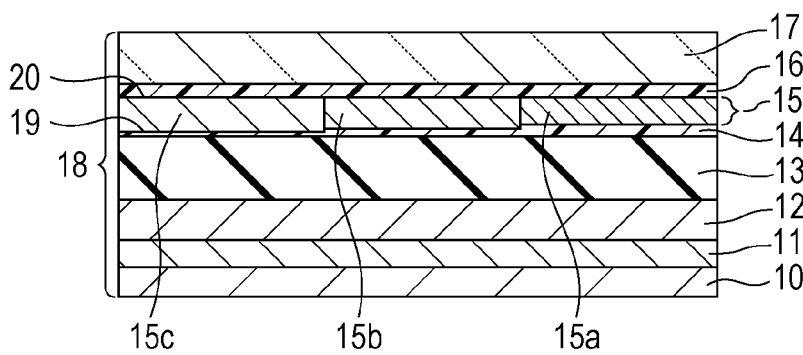
FIG. 1A is a schematic sectional view illustrating an organic light-emitting device in the related art provided with an on-glass color filter according to at least one embodiment of the present disclosure.

An organic light-emitting device according to an embodiment of the present disclosure includes an insulating layer, a first organic light-emitting element and a second organic light-emitting element that are disposed on the main surface of the insulating layer, and a color filter layer including a first color filter that is superposed on the first organic light-emitting element in plan view and that passes light with a first wavelength and a second color filter that is superposed on the second organic light-emitting element and that passes light with a second wavelength different from the first wavelength, wherein each of the first color filter and the second color filter has a first surface facing the organic light-emitting element and a second surface opposite to the first surface, a difference between the distance from the first surface of the first color filter to the insulating layer in the direction perpendicular to the main surface of the insulating layer and the distance from the first surface of the second color filter to the insulating layer in the direction perpendicular to the main surface of the insulating layer is smaller than a difference between the distance from the second surface of the first color filter to the insulating layer in the direction perpendicular to the main surface of the insulating layer and the distance from the second surface of the second color filter to the insulating layer in the direction perpendicular to the main surface of the insulating layer, and the concentration of an organic alkali having a nitrogen atom and a hydroxy group contained in the color filter layer is less than $108.2$ ng/cm$^2$. The concentration of the organic alkali is 40 ng/cm$^2$ or less and further optionally 10 ng/cm$^2$ or less.

The concentration may be 0.08 ng/cm$^2$ or more or 0.01 ng/cm$^2$ or more.

Since the organic alkali that is not thermally decomposed is not limited to being removed by only the removal step, the concentration of the organic alkali may be more than 0 ng/cm$^2$.

Regarding the on-chip color filter formed on the organic light-emitting device, the surfaces of colors facing the respective organic light-emitting elements are flush with each other. That is, the color filter layer includes the first color filter that passes light with a first wavelength and the second color filter that passes light with a second wavelength different from the first wavelength. Each of the first color filter and the second color filter has a first surface facing the organic light-emitting element and a second surface opposite to the first surface.

The difference between the distance from the first surface of the first color filter to the insulating layer in the direction perpendicular to the main surface of the insulating layer and the distance from the first surface of the second color filter to the insulating layer in the direction perpendicular to the main surface of the insulating layer is smaller than the difference between the distance from the second surface of the first color filter to the insulating layer in the direction perpendicular to the main surface of the insulating layer and the distance from the second surface of the second color filter to the insulating layer in the direction perpendicular to the main surface of the insulating layer.

When red, green, and blue color filter layers are included, the first surfaces facing the organic light-emitting element of all colors are located at an essentially equal height whereas the second surfaces opposite to the respective first surfaces of the colors are located at heights that differ from each other. This is because the heights of the second surfaces of the color filters of the respective colors differ from each other in the on-chip color filter. Regarding the on-chip color filter, since color filters are formed on the organic light-emitting element in the order of, for example, green, blue, and red, a sequence is generated. In such an instance, the second surfaces are located in decreasing order of proximity to the insulating layer of green, blue, and red. In the on-glass color filter, the second surfaces of the color filters rather than the first surfaces of the color filters are located at the same position.

The second color filter may be arranged next to the first color filter in plan view. Plan view means a view from a point perpendicular to the main surface of the insulating layer.

A third color filter different from the first color filter and the second color filter may be arranged next to the first color filter and the second color filter in plan view. Regarding "next", color filters may be in direct contact with each other or be in contact with each other with a black matrix interposed therebetween.

The organic light-emitting element includes a first electrode, an organic layer, and a second electrode from the substrate side. The first organic light-emitting element being superposed on the first color filter in plan view corresponds to the first electrode being superposed on the first color filter. The same applies to superposition with respect to other organic light-emitting elements. The organic light-emitting element may include a pixel isolation layer for isolating a first electrode from another first electrode adjoining the first electrode. The organic layer and the second electrode may be shared by the plurality of organic light-emitting elements.

The embodiments for realizing the present disclosure will be described below with reference to the drawings.

First Embodiment

FIG. 1A is a schematic sectional view illustrating an organic light-emitting device in the related art provided with an on-glass color filter. This display apparatus is used as an organic light-emitting display. A driving circuit layer 11 disposed on a substrate 10, an OLED layer 12 including a plurality of organic light-emitting elements, a protective layer 13, a first resin layer 14, a color filter layer 15, a second resin layer 16, a cover glass 17 are illustrated.

The color filter layer is composed of a green filter 15a, a blue filter 15b, and a red filter 15c. The color filter layer may be composed of filters that pass other colors. The color filter layer includes a color filter that passes light with a first wavelength, a color filter that passes light with a second wavelength different from the first wavelength, and a color filter that passes light with a third wavelength different from the first wavelength and the second wavelength. FIG. 1A illustrates the green filter 15a, the blue filter 15b, and the red filter 15c as an example. The color filter has a first surface on the substrate side and a second surface opposite to the first surface. In FIG. 1A, since the color filter layer is an on-glass color filter, the first surfaces of the green filter, the blue filter, and the red filter are not flush with each other, and the second surfaces of the green filter, the blue filter, and the red filter are flush with each other. In other words, the difference between the distance from the first surface of the first color filter to the substrate in the direction perpendicular to the main surface of the substrate and the distance from the first surface of the second color filter to the substrate is larger than the difference between the distance from the second surface of the first color filter to the substrate in the direction perpendicular to the main surface of the substrate and the distance from the second surface of the second color filter to the substrate. Such a thickness relationship applies since the color filter layer is bonded after being produced on another substrate.

Since the substrate includes no OLED layer, a heating step can be performed during the formation process of the color filter layer without taking into account the influence of the OLED layer on an organic compound. As a result, the component of the developing solution used for patterning the color filter layer is thermally decomposed and substantially does not remain in the color filter layer.

The driving circuit layer is a layer in which a transistor is disposed in an insulating layer, and the insulating layer may be an inorganic material or an organic material. The driving circuit layer may include a transistor and a capacitor, although not illustrated in the drawing, and the transistor may be a switching transistor or a transistor for controlling an amount of current so as to control the luminance of the organic light-emitting element.

The OLED layer 12 includes a plurality of organic light-emitting elements. The organic light-emitting element includes a first electrode, an organic layer, and a second electrode from the substrate side. The organic compound layer may have a configuration in which, for example, a hole injection layer, a hole transport layer, a light-emitting layer, an electron transport layer, and an electron injection layer are stacked. In addition, the OLED layer 12 can change an emission color in accordance with the material constituting the light-emitting layer. The emission color may be, for example, white, or the light in a specific wavelength range may be emitted.

The protective layer 13 is a layer for protecting the organic light-emitting element and may be composed of, for example, an inorganic material such as silicon nitride. It is better that the protective layer not pass moisture, oxygen, and the like but the protective layer may have moisture permeability since perfect protective performance is not required. In this regard, when the organic light-emitting device takes a flexible, foldable, or stretchable form, the moisture permeability of the protective layer may be increased.

The first resin layer 14 may be disposed for the purpose of, for example, planarizing the surface to be provided with the color filter layer and be composed of, for example, an organic material such as an acrylic resin. The first resin layer may be referred to as a planarization layer in consideration of the purpose.

The color filter layer 15 absorbs a portion of the light emitted from the organic light-emitting element and passes a portion of the light. For example, absorbing the light other than red light and passing the red light enables the red light to be dispersed from the white light. The color filter layer may be composed of an organic material containing a pigment.

The second resin layer 16 may be disposed for the purpose of, for example, planarizing the surface to be provided with a member that is formed on the color filter layer and be composed of an organic material in the manner similar to the first resin layer. The second resin layer is not limited to being disposed in accordance with the configuration of the organic light-emitting device.

The cover glass 17 is a protective member for protecting the organic light-emitting device against an external impact. Glass may be used or other members may be used provided that the members pass the light.

Figure 1B:
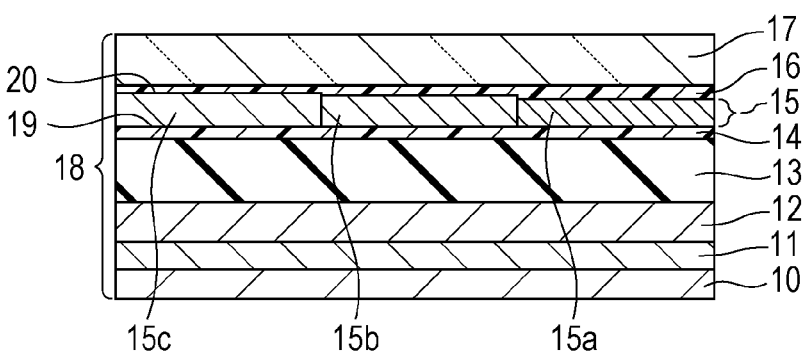
FIG. 1B is a schematic sectional view illustrating an organic light-emitting device according to at least one embodiment of the present disclosure.

FIG. 1B is a schematic sectional view illustrating an organic light-emitting device according to an embodiment of the present disclosure. In contrast to FIG. 1A, since an on-chip color filter is included, the first surfaces of the color filters are flush with each other, and the second surfaces are not flush with each other. In other words, the difference between the distance from the first surface of the first color filter to the substrate in the direction perpendicular to the main surface of the substrate and the distance from the first surface of the second color filter to the substrate is smaller than the difference between the distance from the second surface of the first color filter to the substrate in the direction perpendicular to the main surface of the substrate and the distance from the second surface of the second color filter to the substrate.

The difference between the distance from the first surface of the first color filter to the substrate in the direction perpendicular to the main surface of the substrate and the distance from the first surface of the second color filter to the substrate may be substantially 0.

The color filter layer may be composed of a resin cured at 100° C. or lower since a high temperature heating step is not included regarding the on-chip color filter.

A heating step in which the component of the developing solution is thermally decomposed is not included due to being the on-chip color filter, and the concentration of an organic alkali having a nitrogen atom and a hydroxy group contained in the color filter layer is less than 108.2 ng/cm$^2$. The concentration of the organic alkali can be 40 ng/cm$^2$ or less and optionally can be 10 ng/cm$^2$ or less. In addition, the concentration may be 0.08 ng/cm$^2$ or more or 0.01 ng/cm$^2$ or more. In the situation in which a developing solution containing the organic alkali is used, since the organic alkali that is not thermally decomposed is not limited to being removed by only a step of reducing the organic alkali, the concentration of the organic alkali may be more than 0 ng/cm$^2$.

The organic alkali may be reduced or removed in the step of reducing the organic alkali during the formation process of the color filter layer.

According to the present embodiment, the organic light-emitting device including the on-chip color filter and having high reliability can be provided. The reliability denotes an unlit defect or the like being unlikely to occur during use for a long time.

Figure 1C:
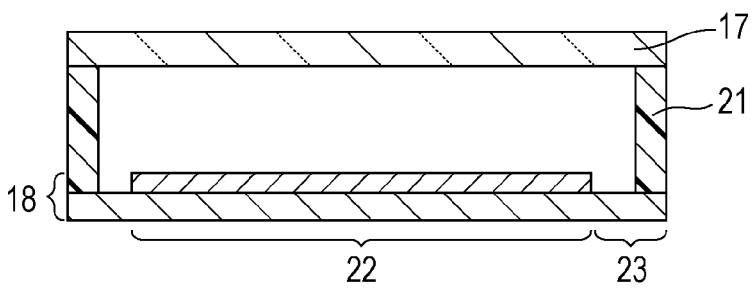
FIG. 1C is a schematic view illustrating an organic light-emitting device according to at least one embodiment of the present disclosure.

FIG. 1C is a schematic view illustrating an organic light-emitting device according to another embodiment of the present disclosure. The display panel 18 composed of the organic light-emitting device is bonded to a cover glass 17 by using a binder resin 21. The portion surrounded by the binder resin 21 may be a hollow layer as illustrated in FIGS. 1A and 1B. In FIG. 1C, the adhesive member is disposed beside the organic light-emitting device as an example, but the adhesive member may be disposed on the organic light-emitting device. The binder resin may be composed of an acrylic resin, an epoxy resin, or the like.

The organic light-emitting device includes a light-emitting region 22 and a non-light-emitting region 23, and a dummy pixel may be disposed in the non-light-emitting region 23. In addition, a pad electrode or the like, which is connected to an external circuit, may be disposed in the non-light-emitting region.

Figure 2:
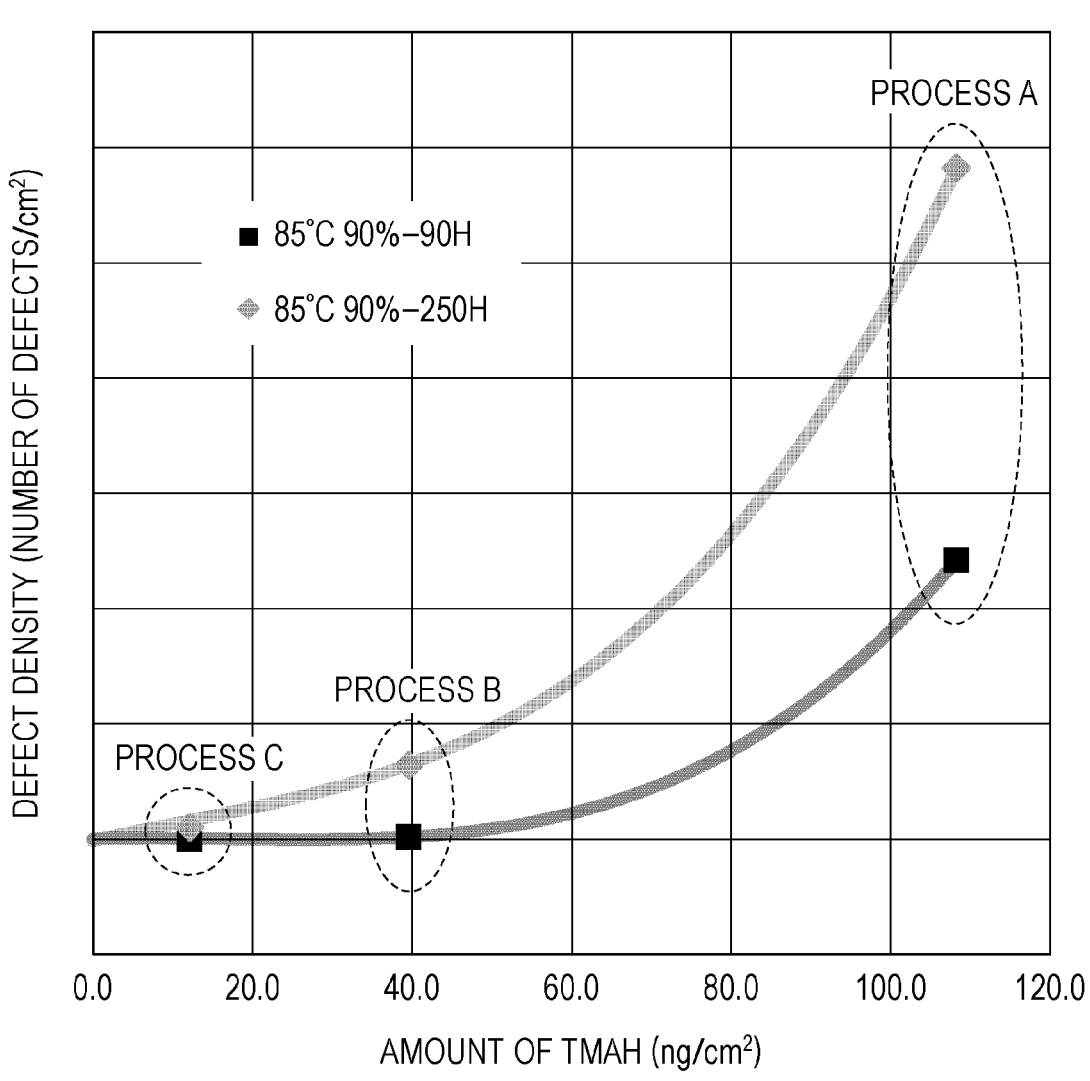
FIG. 2 is a graph illustrating the relationship between a TMAH concentration and the number of defects of a color filter.

FIG. 2 is a graph illustrating the relationship between the tetramethylammonium hydroxide concentration and the number of defects.

The on-chip color filter is formed by patterning the color filter on the OLED layer. A developing solution is used during patterning. Tetramethylammonium hydroxide is used as the component of the developing solution. Hereafter tetramethylammonium hydroxide is referred to as TMAH. TMAH is an organic alkali having a nitrogen atom and a hydroxy group.

Regarding the on-glass color filter, since the color filter is cured at a temperature higher than the decomposition temperature of TMAH, TMAH is unlikely to remain in the color filter. On the other hand, since the on-chip color filter is cured at a temperature lower than the decomposition temperature of TMAH, TMAH tends to remain in the organic light-emitting device.

FIG. 2 is a graph illustrating the relationship between the TMAH concentration and the number of defects in a process A in which the on-chip color filter was formed by a method without using the present disclosure and in a process B and a process C in which the on-chip color filter according to the present disclosure was formed. In this regard, the defect denotes the number of defects occurred in the organic light-emitting device after a lapse of a predetermined time during an acceleration test at a high temperature and a high humidity.

The curved lines in FIG. 2 indicate the tendency of detects occurred in the color filter layer when the wafers produced in the processes A to C were made into individual pieces and stored for a predetermined time in a high-temperature and high-humidity environment at a temperature of 85° C. and a humidity of 90%. The individual pieces were provided with neither the binder resin nor the cover glass illustrated in FIG. 1C.

The horizontal axis of FIG. 2 represents the amount of remaining TMAH (ng/cm$^2$) of the process A in which TMAH in the color filter layer was not sufficiently reduced and the process B and the process C in which the treatment of reducing TMAH was performed during formation of the color filter layer, and the vertical axis represents the number of defects occurred on the lens in each storage time (90 h and 250 h) at 85° C. and 90%. That is, the process A is a comparative example, and the process B and the process C illustrate the result of the organic light-emitting device according to the present disclosure. In this regard, a common developing process exerts a TMAH-reducing effect similar to that of a process in which a TMAH reduction is not sufficient.

The TMAH concentration of the horizontal axis was determined by extracting TMAH on the wafer after the treatment in each process and extracting the amount of TMAH by using an ion chromatograph method (hereafter referred to as an IC method). The TMAH concentration per unit area of the color filter layer was calculated from the measured value of TMAH.

In the process A, it was observed that defects occurred at each storage time. Defects occurred at each storage time in the process B and the process C were less than that in the process A in number.

Table 1 presents the amount of remaining TMAH (ng/cm$^2$) as a result of each process.

TABLE 1

| | Amount of TMAH (ng/cm$^2$) |
| --- | --- |
| Process A | 108.2 |
| Process B | 39.6 |
| Process C | 12.1 |

The numerical value of the amount of remaining TMAH (ng/cm$^2$) contained in the color filter layer 15 of each of the process A in which the treatment of reducing TMAH was not performed and the process B and the process C in which the treatment of reducing TMAH was performed is presented.

According to Table 1, the amount of remaining TMAH that reduces occurrences of defects is less than 108.2 ng/cm$^2$, or 40 ng/cm$^2$ or less, and further optionally 10 ng/cm$^2$. In addition, the amount of remaining TMAH may be 0.08 ng/cm$^2$, which is a detection lower limit, or more or may be 0.01 ng/cm$^2$ or more. In this regard, since the color filter is produced using TMAH and since TMAH remains in the color filter layer, the amount may be more than 0 ng/cm$^2$.

Second Embodiment

Figure 3A:
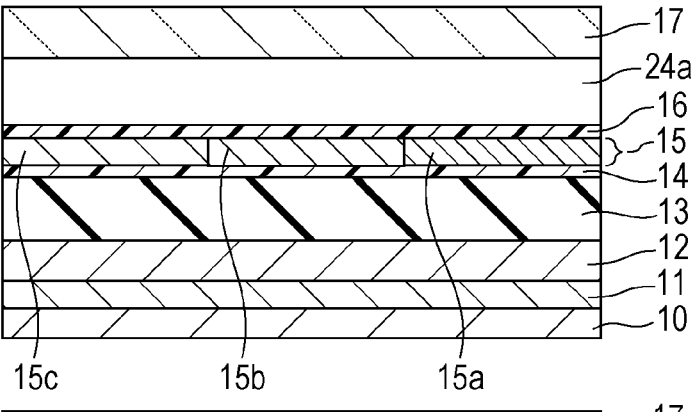
FIGS. 3A to 3D are schematic sectional views illustrating organic light-emitting devices according to other embodiments of the present disclosure.

FIG. 3A is a schematic sectional view illustrating an organic light-emitting device according to another embodiment of the present disclosure. The organic light-emitting device according to the present embodiment has a configuration in which the surface of the second resin layer 16 is contact with a hollow layer 24a and is sealed by the cover glass 17 above the second resin layer. In the present embodiment, an on-chip color filter is used, and differences in the distance from the substrate to the color filter between the second surfaces of the color filters are omitted.

Third Embodiment

Figure 3B:
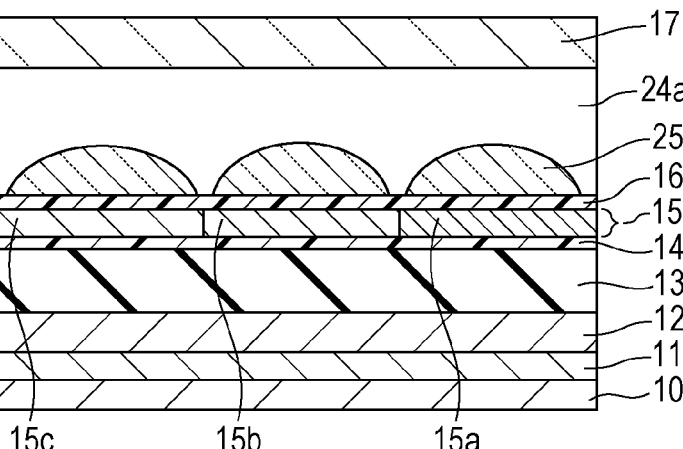

FIG. 3B is a schematic sectional view illustrating an organic light-emitting device according to another embodiment of the present disclosure. In the organic light-emitting device according to the present embodiment, lenses 25 are disposed on the second resin layer 16. The lens 25 condenses light emitted from the organic light-emitting element. In FIG. 3B, a convex lens is illustrated as an example, but a concave lens may be adopted. A lens is disposed for each organic light-emitting element, but a plurality of lenses may be disposed for each organic light-emitting element. The lens may be referred to as a microlens in accordance with the size. The lens may be composed of, for example, an organic material or an inorganic film such as SiN.

The hollow layer 24a may include gas. It may be said that the hollow layer 24a is filled with gas. The refractive index can be close to 1 so that the lens 25 exerts an effect of condensing light. Such a structure including a hollow layer is also referred to as a hollow structure. The hollow layer in short is a gap. In the hollow structure, a lens, gas such as air, and a protective member may be arranged in this order. The protective member is bonded to a substrate, a protective layer, or the like by using a binder member described later. In this regard, in the present embodiment, the on-chip color filter is used, and differences in the distance from the substrate to the color filter between the second surfaces of the color filters are omitted.

Fourth Embodiment

Figure 3C:
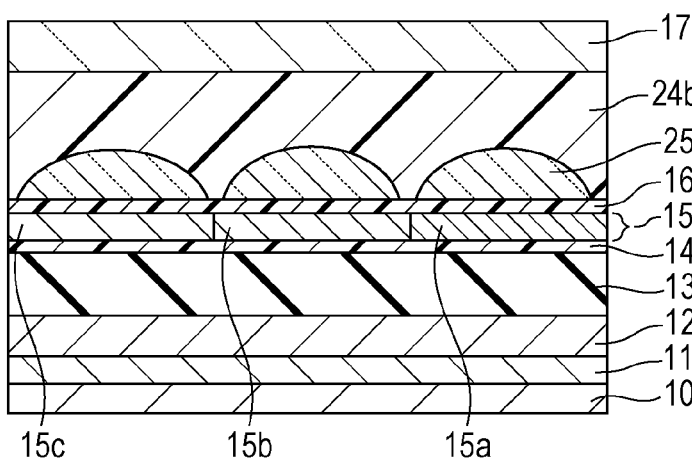

FIG. 3C is a schematic sectional view illustrating an organic light-emitting device according to another embodiment of the present disclosure. The organic light-emitting device is akin to that of the third embodiment except that a sealing layer 24b rather than the hollow layer is disposed on the lens 25. The sealing layer 24b may be composed of, for example, a resin such as an acrylic resin or an epoxy resin. The display apparatus 18 is sealed by the cover glass 17 with the sealing layer 24b interposed therebetween. The difference between the refractive index of the sealing layer 24b and the refractive index of the lens can be large. Specifically, the refractive index of the sealing layer can be smaller than the refractive index of the lens and be closer to 1. In addition, the refractive index of the sealing layer can be smaller than the average value of the refractive index of the lens and the refractive index of air. That is, the refractive index of the sealing layer can be closer to the refractive index of air rather than to the refractive index of the lens. It is better that the sealing layer 24b not pass moisture, oxygen, and the like, but the sealing layer 24b may have moisture permeability since perfect protective performance is not required. Since the possibility of an occurrence of a reaction between an organic alkali in the developing solution and the water increases with increasing moisture permeability of the sealing layer 24b, the problem of the present disclosure becomes significant. In this regard, in the present embodiment, the on-chip color filter is used, and differences in the distance from the substrate to the color filter between the second surfaces of the color filters are omitted.

Figure 3D:
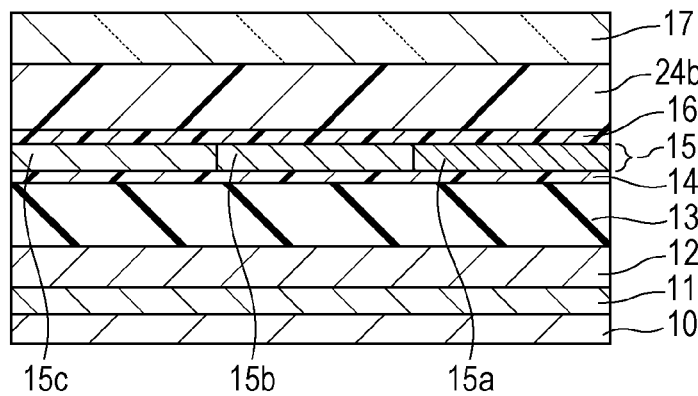

FIG. 3D is a schematic sectional view illustrating an organic light-emitting device according to another embodiment of the present disclosure. No lens is disposed on the surface layer of the second resin layer 16, and the display apparatus 18 is sealed by the cover glass 17 with the sealing layer 24b interposed therebetween. In this regard, in the present embodiment, the on-chip color filter is used, and differences in the distance from the substrate to the color filter between the second surfaces of the color filters are omitted.

Color Filter Manufacturing Process

A method for manufacturing the color filter of the organic light-emitting device according to the present disclosure will be described below with reference to FIGS. 4A to 4C. A method for manufacturing the organic light-emitting device according to the present embodiment includes a step of forming an organic light-emitting element on the main surface of an insulating layer and a step of forming a color filter layer on the organic light-emitting element. The step of forming a color filter layer is a photolithography step and includes a step of applying a resin to the organic light-emitting element, a step of selectively exposing the resin through a photomask, and a step of developing the resin by using a developing solution containing an organic alkali having a nitrogen atom and a hydroxy group. The method for manufacturing an organic light-emitting device according to the present disclosure includes a step of reducing the organic alkali in the color filter layer after the developing step. In the present embodiment, TMAH is used as the organic alkali. In this regard, the present disclosure is not limited to this.

Figure 4A:
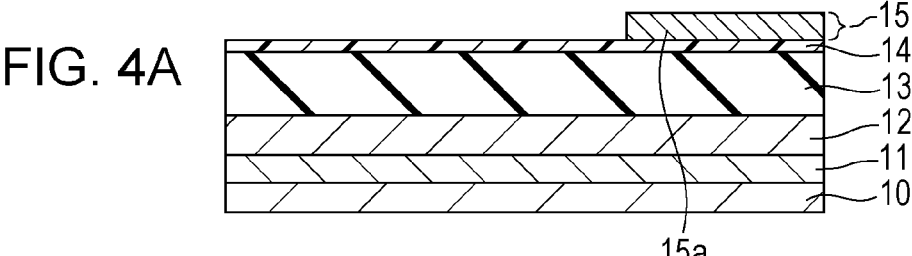
FIG. 4A is a schematic view illustrating a step of producing a green filter of an organic light-emitting device according to at least one embodiment of the present disclosure.

FIG. 4A is a schematic view illustrating a step of producing a green filter of the organic light-emitting device according to an embodiment of the present disclosure. A substrate 10 is prepared, and a driving circuit layer 11 including a driving circuit is formed on the substrate 10. Subsequently, an OLED layer 12 including an electrode and an organic layer is formed on the driving circuit layer 11. A protective layer 13 is formed on the OLED layer 12 by a film formation method such as a CVD method or a sputtering method. The temperature during formation of the protective layer 13 can be set to be 110° C. or lower or can be 100° C. or lower. A first resin layer 14 is formed on the protective layer 13 by a film formation method such as a spin coating method. A green filter 15a serving as a color filter layer of a first color is formed on the first resin layer 14.

Regarding the color filter, an organic material containing a pigment is applied by a spin coating method or the like, patterning is performed by photolithography, and development is performed using an alkali developing solution containing TMAH.

After the development step, the surface layer of the color filter is physically washed through two fluid rinse by using pure water so that TMAH remaining on the surface and the side surface of the green filter 15a is reduced. A washing liquid may contain 80% or more of pure water. The washing step may be performed by a method of two fluid rinse, dipping, or the like, and the two fluid rinse can be adopted. The same applies to the washing step of other color filters.

After the development step, the color filter may be formed by light irradiation or firing at 110° C. or lower or can be formed by firing at 100° C. or lower. The step of heating the color filter layer can be a step of heating at a temperature lower than or equal to the glass transition temperature of the organic compound constituting the organic layer included in the organic light-emitting element.

Figure 4B:
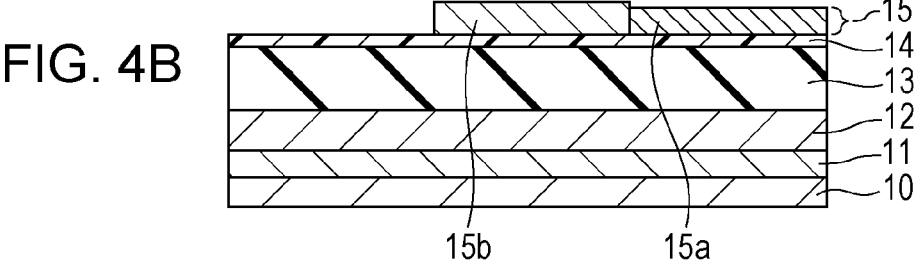
FIG. 4B is a schematic view illustrating a step of forming a blue filter of an organic light-emitting element according to at least one embodiment of the present disclosure.

FIG. 4B is a schematic view illustrating a step of forming a blue filter of the organic light-emitting element. After the green filter 15a is formed, a blue filter 15b serving as a color filter layer of a second color is formed. Regarding the color filter, an organic material containing a pigment is applied by a spin coating method or the like, patterning is performed by photolithography, and development is performed using an alkali developing solution containing TMAH. After the development step, the surface layer of the color filter is washed by using Nanospray so that TMAH remaining on the surfaces of the green filter 15a and the blue filter 15b and the side surfaces of the green filter 15a and the blue filter 15b is reduced.

After the development step, the color filter may be formed by light irradiation or firing at 130° C. or lower or can be formed by firing at 110° C. or lower. The step of heating the color filter layer can be a step of heating at a temperature lower than or equal to the glass transition temperature of the organic compound constituting the organic layer included in the organic light-emitting element.

Figure 4C:
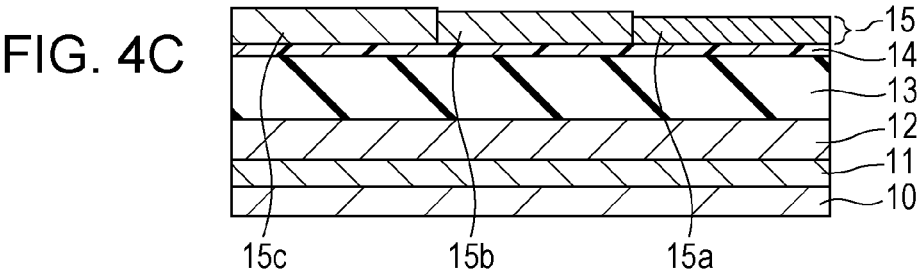
FIG. 4C is a schematic view illustrating a step of forming a red filter of an organic light-emitting element according to at least one embodiment of the present disclosure.

FIG. 4C is a schematic view illustrating a step of forming a red filter of the organic light-emitting element. After the blue filter 15b is formed, a red filter 15c serving as a color filter layer of a third color is formed. Regarding the color filter, an organic material containing a pigment is applied by a spin coating method or the like, patterning is performed by photolithography, and development is performed using an alkali developing solution containing TMAH. After the development step, the surface layer of the color filter is washed by using Nanospray so that TMAH remaining on the surfaces of the green filter 15a, the blue filter 15b, and the red filter 15c is reduced.

After the development step, the color filter may be formed by light irradiation or firing at 130° C. or lower or can be formed by firing at 110° C. or lower. The step of heating the color filter layer can be a step of heating at a temperature lower than or equal to the glass transition temperature of the organic compound constituting the organic layer included in the organic light-emitting element.

Since the color filter according to the present embodiment is the on-chip color filter, the heating step of the color filter is performed at a temperature lower than or equal to the decomposition temperature of the developing solution.

Figure 4D:
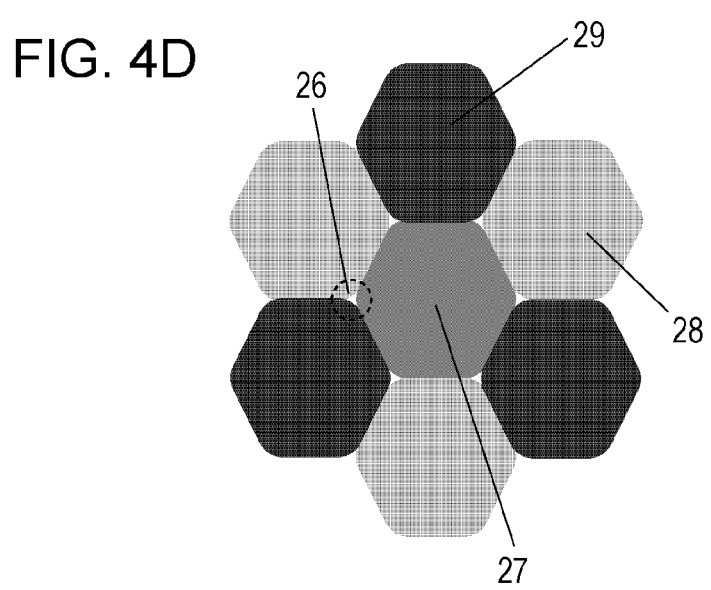
FIG. 4D is a plan view illustrating a non-limiting example of an organic light-emitting device according to at least one embodiment of the present disclosure.

FIG. 4D is a plan view illustrating an example of the organic light-emitting device according to at least one of the present embodiments. Regarding each of green, blue, and red color filters according to the present embodiment, a corner portion being rounded enables a region 26 provided with no color filter to be formed (FIG. 4D). Consequently, in the washing step after development, a rinse liquid is readily recycled through the color filter boundary portion, and removal of TMAH is facilitated. The region 26 provided with no color filter may be filled with the second resin layer applied after the color filter is formed. For example, the green color filter is assumed to be a first color filter, the blue color filter is assumed to be a second color filter, and the red color filter is assumed to be a third color filter. As a result, in the organic light-emitting device, the second resin layer is disposed on the first color filter 27 and the second color filter 28, and the second resin layer is also disposed between the first color filter 27 and the second color filter 28. The second resin layer may be a so-called planarization layer.

The region 26 provided with no color filter may also be disposed between the first color filter 27 and the third color filter 29. The second resin layer may be disposed in the region between the first color filter 27 and the third color filter 29. The second resin layer may cover at least the entire display region. That is, the second resin layer is also disposed on the third color filter. It can be said that the second resin layer is continuously disposed on the entire display region.

According to the present embodiment, the organic light-emitting device having a reduced TMAH concentration can be produced.

Structure of Organic Light-Emitting Device

The organic light-emitting device is produced by forming an insulating layer, a first electrode, an organic compound layer, and a second electrode on a substrate. A protective layer, a color filter, a microlens, and the like may be disposed on the cathode.

When a color filter is provided, a planarization layer may be disposed between the color filter and the protective layer. The planarization layer can be formed of an acrylic resin or the like. The same also applies to the case where a planarization layer is disposed between the color filter and the microlens.

Substrate

Examples of the substrate include quartz substrates, glass substrates, silicon wafers, resin substrates, and metal substrates. Furthermore, switching elements, such as transistors, and wiring lines may be disposed on the substrate, and an insulating layer may be disposed thereon. The insulating layer may be formed of any material as long as a contact hole can be formed therein so as to form a wiring line between the insulating layer and the first electrode and as long as the material can provide insulation from a wiring line that is not to be connected. Examples of the material include resins such as polyimide, silicon oxide, and silicon nitride.

Electrode

A pair of electrodes can be used as the electrodes. The pair of electrodes may be an anode and a cathode.

In the case where an electric field is applied in a direction in which the organic light-emitting device emits light, the electrode with a higher electric potential is the anode, and the other electrode is the cathode. To put it differently, the electrode that supplies holes to the light-emitting layer is the anode, and the electrode that supplies electrons is the cathode.

The material constituting the anode can have a work function that is as large as possible. Examples of the material include elemental metals such as gold, platinum, silver, copper, nickel, palladium, cobalt, selenium, vanadium, and tungsten; mixtures containing these metals; alloys of these metals; and metal oxides such as tin oxide, zinc oxide, indium oxide, indium tin oxide (ITO), and indium zinc oxide. Examples thereof further include conductive polymers such as polyaniline, polypyrrole, and polythiophene.

These electrode substances may be used alone or in combination of two or more thereof. The anode may be formed of a single layer or a plurality of layers.

When the anode is used as a reflective electrode, for example, chromium, aluminum, silver, titanium, tungsten, molybdenum, an alloy thereof, or a layered structure thereof can be used. The above materials may be used to function as a reflective film that does not have a role of an electrode. When the anode is used as a transparent electrode, a transparent conductive oxide layer such as an indium tin oxide (ITO) or indium zinc oxide layer may be used; however, the anode is not limited thereto.

The electrodes may be formed by photolithography.

In contrast, the material constituting the cathode can have a small work function. Examples of the material of the cathode include alkali metals such as lithium; alkaline earth metals such as calcium; elemental metals such as aluminum, titanium, manganese, silver, lead, and chromium; and mixtures containing these metals. Alloys of these elemental metals may also be used. For example, magnesium-silver, aluminum-lithium, aluminum-magnesium, silver-copper, and zinc-silver may be used. Metal oxides such as indium tin oxide (ITO) may also be used. These electrode substances may be used alone or in combination of two or more thereof. The cathode may have a single-layer structure or a multi-layer structure. In particular, silver can be used. To reduce the aggregation of silver, a silver alloy can be used. The alloying ratio is not limited as long as the aggregation of silver can be reduced. The ratio of silver to another metal may be, for example, 1:1 or 3:1.

The cathode is not particularly limited. The cathode may be a conductive oxide layer made of ITO or the like to provide a top-emission device. Alternatively, the cathode may be a reflective electrode made of aluminum (Al) or the like to provide a bottom-emission device. The method for forming the cathode is not particularly limited. For example, a DC or AC sputtering method can be used because good film coverage is achieved and thus the resistance is easily reduced.

Organic Compound Layer

The organic compound layer may be formed of a single layer or a plurality of layers. When the organic compound layer includes a plurality of layers, the layers may be referred to as a hole injection layer, a hole transport layer, an electron blocking layer, a light-emitting layer, a hole blocking layer, an electron transport layer, or an electron injection layer depending on their functions. The organic compound layer is mainly composed of an organic compound and may contain inorganic atoms and an inorganic compound. For example, the organic compound layer may contain copper, lithium, magnesium, aluminum, iridium, platinum, molybdenum, zinc, or the like. The organic compound layer may be disposed between the first electrode and the second electrode and may be disposed in contact with the first electrode and the second electrode.

Protective Layer

A protective layer may be disposed on the cathode. For example, a glass member having a moisture absorbent can be bonded to the cathode to reduce the entry of, for example, water into the organic compound layer, thereby reducing the occurrence of display defects. In another embodiment, a passivation film composed of silicon nitride or the like may be disposed on the cathode to reduce the entry of, for example, water into the organic compound layer. For example, after the formation of the cathode, the resulting substrate may be transferred to another chamber without breaking the vacuum, and a protective layer may be formed thereon by forming a silicon nitride film having a thickness of 2 μm by a CVD method. A protective layer may be formed by an atomic layer deposition method (ALD method) after the film deposition by a CVD method. The material of the film formed by the ALD method is not limited and may be, for example, silicon nitride, silicon oxide, or aluminum oxide. Silicon nitride may be further deposited by the CVD method on the film formed by the ALD method. The film formed by the ALD method may have a smaller thickness than the film formed by the CVD method. Specifically, the film thickness may be 50% or less, even 10% or less.

Color Filter

A color filter may be disposed on the protective layer. For example, a color filter that takes into account the size of the organic light-emitting device may be disposed on another substrate, and the substrate may be bonded to a substrate having the organic light-emitting device thereon. Alternatively, a color filter may be formed on the aforementioned protective layer by photolithographic patterning. The color filter may be formed of a polymer.

Planarization Layer

A planarization layer may be disposed between the color filter and the protective layer. The planarization layer is formed in order to reduce unevenness of the underlying layer. The planarization layer may be referred to as a material resin layer without limiting the purpose thereof. The planarization layer may be formed of an organic compound and may have a low molecular weight or a high molecular weight. The planarization layer can have a high molecular weight.

The planarization layer may be disposed above and below the color filter, and both the planarization layers may be formed of the same material or different materials. Specific examples of the material include polyvinylcarbazole resins, polycarbonate resins, polyester resins, acrylonitrile-butadiene-styrene (ABS) resins, acrylic resins, polyimide resins, phenolic resins, epoxy resins, silicone resins, and urea resins.

Microlens

An organic light-emitting apparatus may include an optical member such as a microlens on the light output side. The microlens can be composed of an acrylic resin, an epoxy resin, or the like. The microlens may be used to increase the amount of light extracted from the organic light-emitting apparatus and control the direction of the extracted light. The microlens may have a hemispherical shape. In the case of a hemispherical shape, among tangents in contact with the hemisphere, there is a tangent parallel to the insulating layer, and the contact point between the tangent and the hemisphere is the vertex of the microlens. The vertex of the microlens can be determined in the same manner in any sectional view. That is, among the tangents in contact with the semicircle of the microlens in the sectional view, there is a tangent parallel to the insulating layer, and the contact point between the tangent and the semicircle is the vertex of the microlens.

The midpoint of the microlens can also be defined. In a section of the microlens, a line segment from a point where the arc shape ends to another point where the arch shape ends is assumed, and the midpoint of the line segment can be referred to as the midpoint of the microlens. The section in which the vertex and the midpoint are determined may be a section perpendicular to the insulating layer.

Opposite Substrate

An opposite substrate may be disposed on the planarization layer. The opposite substrate is disposed at a position corresponding to the aforementioned substrate and thus is referred to as an opposite substrate. The opposite substrate may be composed of the same material as the aforementioned substrate. When the aforementioned substrate is defined as a first substrate, the opposite substrate may be defined as a second substrate.

Organic Layer

Organic compound layers (such as a hole injection layer, a hole transport layer, an electron blocking layer, a light-emitting layer, a hole blocking layer, an electron transport layer, and an electron injection layer) constituting the organic light-emitting device according to an embodiment of the present disclosure are formed by the methods described below.

The organic compound layers constituting the organic light-emitting device according to an embodiment of the present disclosure can be formed by a dry process, such as a vacuum deposition method, an ionized deposition method, sputtering, or plasma. Instead of the dry process, a wet process involving dissolving a material in an appropriate solvent, and then forming a layer by a publicly known coating method (for example, spin coating, dipping, a casting method, a Langmuir-Blodgett (LB) method, or an ink jet method) can also be employed.

When a layer is formed by a vacuum deposition method, a solution coating method, or the like, for example, crystallization is unlikely to occur, and good stability over time is obtained. When a film is formed by a coating method, a material can be combined with an appropriate binder resin to form the film.

Examples of the binder resin include, but are not limited to, polyvinylcarbazole resins, polycarbonate resins, polyester resins, ABS resins, acrylic resins, polyimide resins, phenolic resins, epoxy resins, silicone resins, and urea resins.

These binder resins may be used alone as a homopolymer or a copolymer or in combination as a mixture of two or more thereof. Furthermore, publicly known additives such as a plasticizer, an oxidation inhibitor, and an ultraviolet absorbent may be optionally used in combination.

Pixel Circuit

A light-emitting apparatus may include a pixel circuit connected to a light-emitting device. The pixel circuit may be an active matrix-type circuit that independently controls light emission of a first light-emitting device and a second light-emitting device. The active matrix-type circuit may be a voltage programming or current programming circuit. A driving circuit has a pixel circuit for each pixel. The pixel circuit may have a light-emitting device, a transistor that controls the emission luminance of the light-emitting device, a transistor that controls the timing of light emission, a capacitor that holds the gate voltage of the transistor that controls the emission luminance, and a transistor for connecting to GND without through the light-emitting device.

The light-emitting apparatus has a display region and a peripheral region around the display region. The display region includes a pixel circuit, and the peripheral region includes a display control circuit. The mobility of transistors constituting the pixel circuit may be smaller than the mobility of transistors constituting the display control circuit.

The slope of the current-voltage characteristics of the transistors constituting the pixel circuit may be smaller than the slope of the current-voltage characteristics of the transistors constituting the display control circuit. The slope of the current-voltage characteristics can be measured by the so-called Vg-Ig characteristics.

The transistors constituting the pixel circuit are transistors connected to light-emitting devices including the first light-emitting device.
Pixel The organic light-emitting apparatus includes a plurality of pixels. The pixels include subpixels that emit light of a color different from the other colors. The subpixels may individually emit, for example, light of colors of RGB.

The pixels each emit light from an area that is also called a pixel aperture. This area is the same as a first area.

The pixel aperture may have a size of 15 μm or less and 5 μm or more. More specifically, the pixel aperture may be, for example, 11 μm, 9.5 μm, 7.4 μm, or 6.4 μm.

The distance between the subpixels may be 10 μm or less and may be specifically 8 μm, 7.4 μm, or 6.4 μm.

The pixels can have a publicly known arrangement form in plan view. For example, the arrangement form may be the stripe arrangement, the delta arrangement, the PenTile arrangement, or the Bayer arrangement. The subpixels may have any publicly known shape in plan view. For example, the shape may be a quadrangle such as a rectangle or a rhombus, or a hexagon. Of course, figures that are not exactly rectangles but are close to rectangles are also regarded as rectangles. The shape of the subpixels and the pixel arrangement can be used in combination.
Application of Organic Light-Emitting Device According to an Embodiment of the Present Disclosure The organic light-emitting device according to an embodiment of the present disclosure can be used as a constituent member of a display apparatus or an illumination apparatus. In addition, the organic light-emitting device is used in, for example, an exposure light source of an electrophotographic image forming apparatus, a backlight of a liquid crystal display apparatus, and a light-emitting apparatus including a white light source and a color filter.

The display apparatus may be an image information processing apparatus that includes an image input unit to which image information is input from an area CCD, a linear CCD, a memory card, or the like and an information processing unit configured to process the input information, and that displays an input image on a display unit.

The display unit included in an imaging apparatus or an ink jet printer may have a touch panel function. The touch panel function may be operated by using infrared, an electrostatic capacitance, a resistive film, or electromagnetic induction, and the operation method is not particularly limited. The display apparatus may be used in a display unit of a multifunctional printer.

Next, a display apparatus according to the present embodiment will be described with reference to the drawings.

Figure 5:
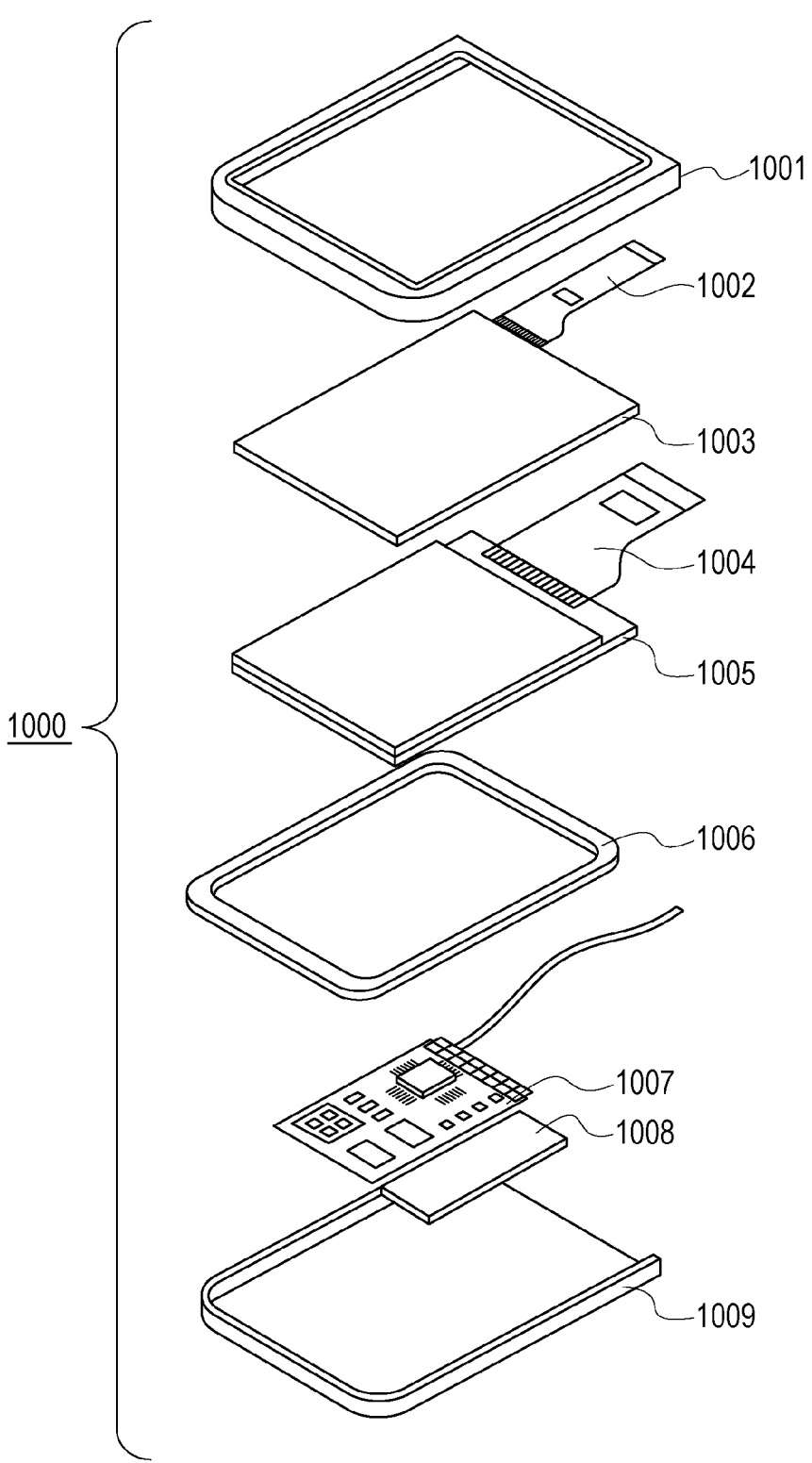
FIG. 5 is a schematic view illustrating a non-limiting example of a display apparatus according to at least one embodiment of the present disclosure.

FIG. 5 is a schematic view illustrating an example of a display apparatus according to the present embodiment. A display apparatus 1000 may include an upper cover 1001 and a lower cover 1009, and a touch panel 1003, a display panel 1005, a frame 1006, a circuit substrate 1007, and a battery 1008 that are disposed between the upper cover 1001 and the lower cover 1009. The touch panel 1003 and the display panel 1005 are connected to flexible printed circuits FPC 1002 and 1004, respectively. Transistors are printed onto the circuit substrate 1007. The battery 1008 is not necessarily installed unless the display apparatus is a portable apparatus or may be installed in a different position even if the display apparatus is a portable apparatus.

The display apparatus according to the present embodiment may include a color filter having red, green, and blue portions. The red, green, and blue portions of the color filter may be arranged in the delta arrangement.

The display apparatus according to the present embodiment may be used in a display unit of a portable terminal. In such a case, the display apparatus may have both a display function and an operation function. Examples of the portable terminal include mobile phones such as smart phones, tablets, and head mount displays.

The display apparatus according to the present embodiment may be used in a display unit of an imaging apparatus including an optical unit that includes a plurality of lenses and an imaging device that receives light that has passed through the optical unit. The imaging apparatus may include a display unit that displays information acquired by the imaging device. The display unit may be a display unit exposed to the outside of the imaging apparatus or a display unit disposed in a viewfinder. The imaging apparatus may be a digital camera or a digital camcorder.

Figure 6A:
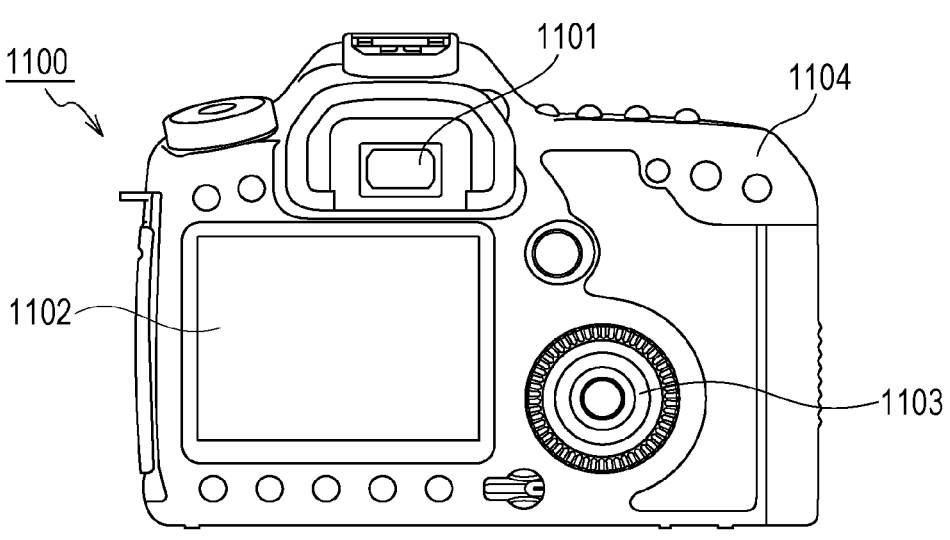
FIG. 6A is a schematic view illustrating a non-limiting example of an imaging apparatus according to at least one embodiment of the present disclosure.

FIG. 6A is a schematic view illustrating an example of an imaging apparatus according to the present embodiment. An imaging apparatus 1100 may include a viewfinder 1101, a rear surface display 1102, an operation unit 1103, and a housing 1104. The viewfinder 1101 may include a display apparatus according to the present embodiment. In such a case, the display apparatus may display not only an image to be captured but also, for example, environmental information and imaging instructions. The environmental information may include, for example, the intensity of external light, the direction of external light, the moving speed of the subject, and the possibility that the subject may hide behind an obstacle.

Since the suitable timing for capturing an image is a very short period of time, it is desirable to display information as quickly as possible. Accordingly, a display apparatus that uses the organic light-emitting device according to the present disclosure can be used. This is because the organic light-emitting device has a high response speed. The display apparatus that uses an organic light-emitting device is more suitable than liquid crystal display apparatuses for use in apparatuses for which a high display speed is required.

The imaging apparatus 1100 includes an optical unit not illustrated in the drawing. The optical unit includes a plurality of lenses and is configured to form an image on an imaging device contained in the housing 1104. The plurality of lenses can adjust the focal point by adjusting their relative positions. This operation can be automatically performed. The imaging apparatus may also be referred to as a photoelectric conversion apparatus. The photoelectric conversion apparatus can employ, instead of a method of successively capturing images, image capturing methods such as a method of detecting a difference from the previous image and a method of extracting images from continuously recorded images.

Figure 6B:
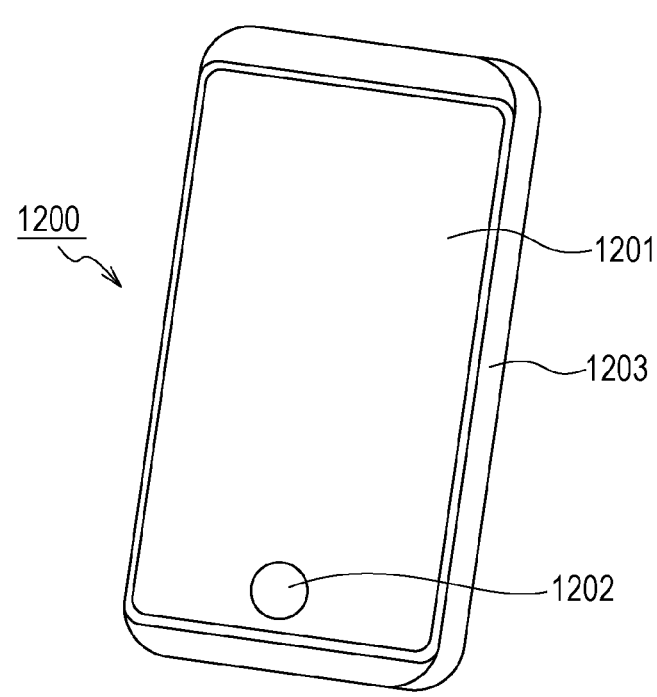
FIG. 6B is a schematic view illustrating a non-limiting example of an electronic apparatus according to at least one embodiment of the present disclosure.

FIG. 6B is a schematic view of an example of an electronic apparatus according to the present embodiment. An electronic apparatus 1200 includes a display unit 1201, an operation unit 1202, and a housing 1203. The housing 1203 may include therein circuits, a print substrate having the circuits, a battery, and a communication unit. The operation unit 1202 may be a button or a touch panel-type responsive unit. The operation unit may be a biometric authentication unit configured to, for example, recognize the fingerprints and release the lock. The electronic apparatus that includes a communication unit can also be referred to as a communication apparatus. The electronic apparatus may include a lens and an imaging device so as to further have a camera function. An image captured by the camera function is displayed on the display unit. Examples of the electronic apparatus include smart phones and notebook computers.

Figures 7A, 7B:
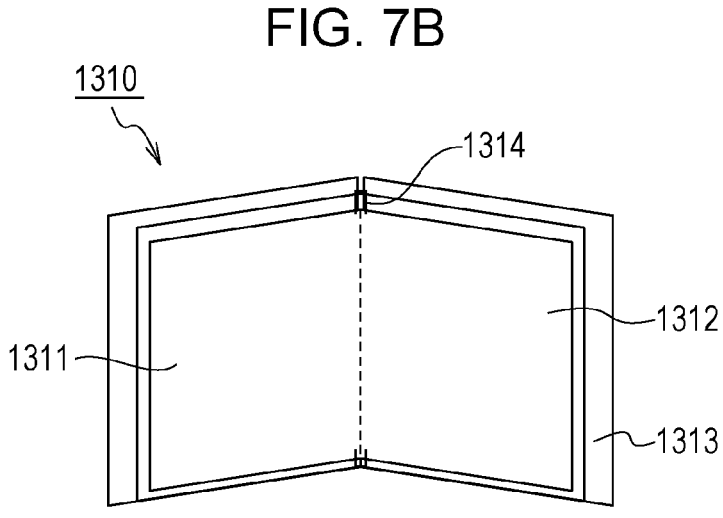
FIG. 7A is a schematic view illustrating a non-limiting example of a display apparatus according to at least one embodiment of the present disclosure.
FIG. 7B is a schematic view illustrating a non-limiting example of a foldable display apparatus according to at least one embodiment of the present disclosure.

FIGS. 7A and 7B are schematic views each illustrating an example of a display apparatus according to the present embodiment. FIG. 7A illustrates a display apparatus such as a television monitor or a PC monitor. A display apparatus 1300 includes a frame 1301 and a display unit 1302. The light-emitting apparatus according to the present embodiment may be used in the display unit 1302.

The display apparatus 1300 further includes a base 1303 that supports the frame 1301 and the display unit 1302. The base 1303 is not limited to the form illustrated in FIG. 7A. The lower side of the frame 1301 may also function as the base.

The frame 1301 and the display unit 1302 may be curved. The radius of curvature thereof may be 5,000 mm or more and 6,000 mm or less.

FIG. 7B is a schematic view of another example of the display apparatus according to the present embodiment. A display apparatus 1310 illustrated in FIG. 7B is configured to be foldable and is the so-called foldable display apparatus. The display apparatus 1310 has a first display unit 1311, a second display unit 1312, a housing 1313, and an inflexion point 1314. Each of the first display unit 1311 and the second display unit 1312 may include the light-emitting apparatus accordion to the present embodiment. The first display unit 1311 and the second display unit 1312 may be a single display apparatus without a joint. The first display unit 1311 and the second display unit 1312 can be separated at the inflexion point. The first display unit 1311 and the second display unit 1312 may respectively display different images. Alternatively, an image may be displayed on a set of the first display unit 1311 and the second display unit 1312.

Figure 8A:
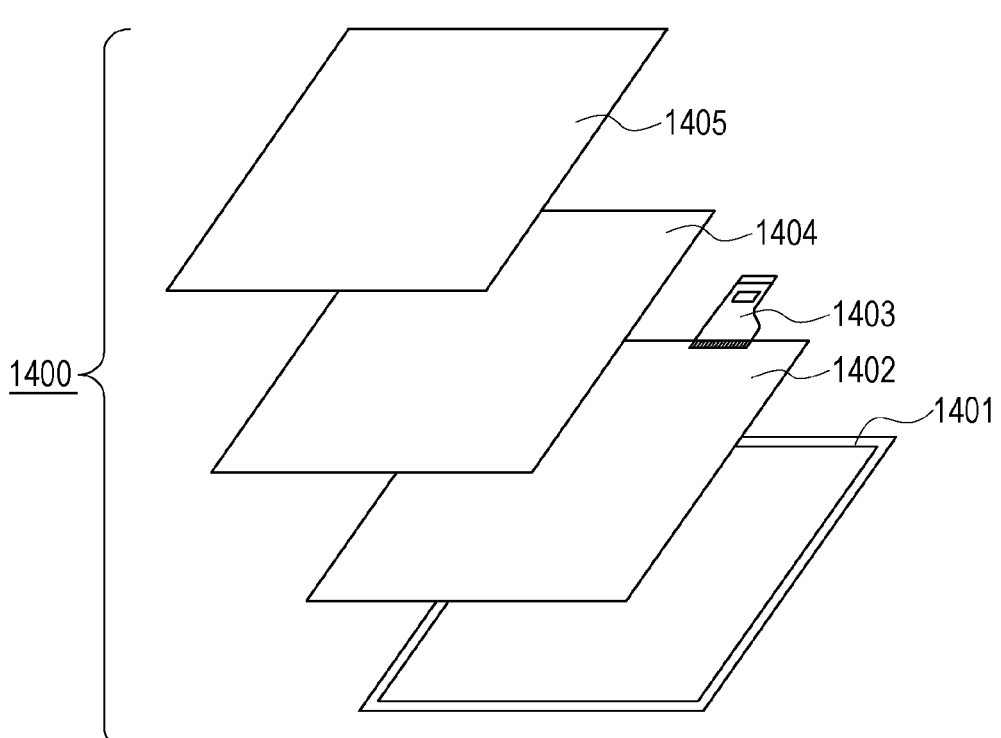
FIG. 8A is a schematic view illustrating a non-limiting example of an illumination apparatus according to at least one embodiment of the present disclosure.

FIG. 8A is a schematic view illustrating an example of an illumination apparatus according to the present embodiment. An illumination apparatus 1400 may include a housing 1401, a light source 1402, a circuit substrate 1403, an optical film 1404, and a light diffusion unit 1405. The light source may include the organic light-emitting device according to the present embodiment. The optical filter may be a filter that improves the color rendering properties of the light source. The light diffusion unit can effectively diffuse light emitted from the light source and allow the light to reach a wide range, for example, for lighting up. The optical filter and the light diffusion unit may be disposed on the light output side of the illumination. A cover may be optionally disposed on the outermost portion.

The illumination apparatus is, for example, an apparatus that illuminates a room. The illumination apparatus may emit light of a color such as white, natural white, or any other color from blue to red. The illumination apparatus may include a light modulating circuit configured to modulate the light.

The illumination apparatus may include the organic light-emitting device according to the present disclosure and a power supply circuit connected to the organic light-emitting device. The power supply circuit is a circuit configured to convert alternating current voltage to direct current voltage. The white is a color having a color temperature of 4,200 K, and the natural white is a color having a color temperature of 5,000 K. The illumination apparatus may include a color filter.

The illumination apparatus according to the present embodiment may include a heat dissipation unit. The heat dissipation unit dissipates heat in the apparatus to the outside of the apparatus. The heat dissipation unit may be formed of, for example, a metal having a high specific heat or liquid silicon.

Figure 8B:
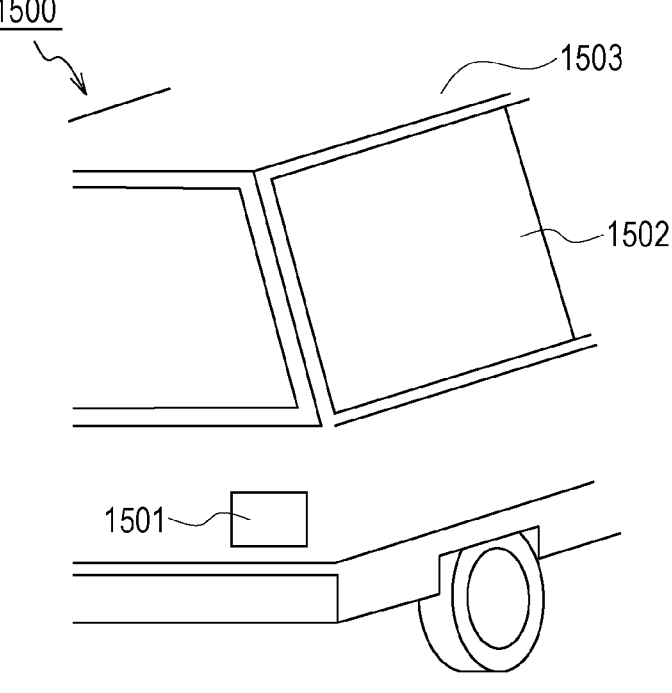
FIG. 8B is a schematic view illustrating a non-limiting example of an automobile having a vehicle lighting fixture according to at least one embodiment of the present disclosure.

FIG. 8B is a schematic view of an automobile, which is an example of a moving object according to the present embodiment. The automobile has a tail lamp, which is an example of a lighting fixture. An automobile 1500 has a tail lamp 1501, and the tail lamp 1501 may light up when, for example, the brakes are applied.

The tail lamp 1501 may include the organic light-emitting device according to the present embodiment. The tail lamp may include a protective member that protects the organic EL device. The protective member may be composed of any material that has high strength to a certain extent and is transparent, and can be composed of a polycarbonate or the like. The polycarbonate may be mixed with a furandicarboxylic acid derivative, an acrylonitrile derivative, or the like.

The automobile 1500 may include a car body 1503 and a window 1502 installed to the car body 1503. The window may be a transparent display unless it is a window for checking of the front and rear of the automobile. The transparent display may include the organic light-emitting device according to the present embodiment. In such a case, the components, such as the electrodes, of the organic light-emitting device are formed of transparent members.

The moving object according to this embodiment may be, for example, a ship, an aircraft, or a drone. The moving object may include a body and a lighting fixture installed to the body. The lighting fixture may emit light to indicate the position of the body. The lighting fixture includes the organic light-emitting device according to the present embodiment.

Examples of applications of the display apparatuses according to the embodiments described above will be described with reference to FIGS. 9A and 9B. The display apparatuses are applicable to systems that can be worn as wearable devices, such as smart glasses, head mount displays (HMDs), and smart contact lenses. An imaging and display apparatus used in such an example of the application includes an imaging apparatus that can photoelectrically convert visible light and a display apparatus that can emit visible light.

Figure 9A:
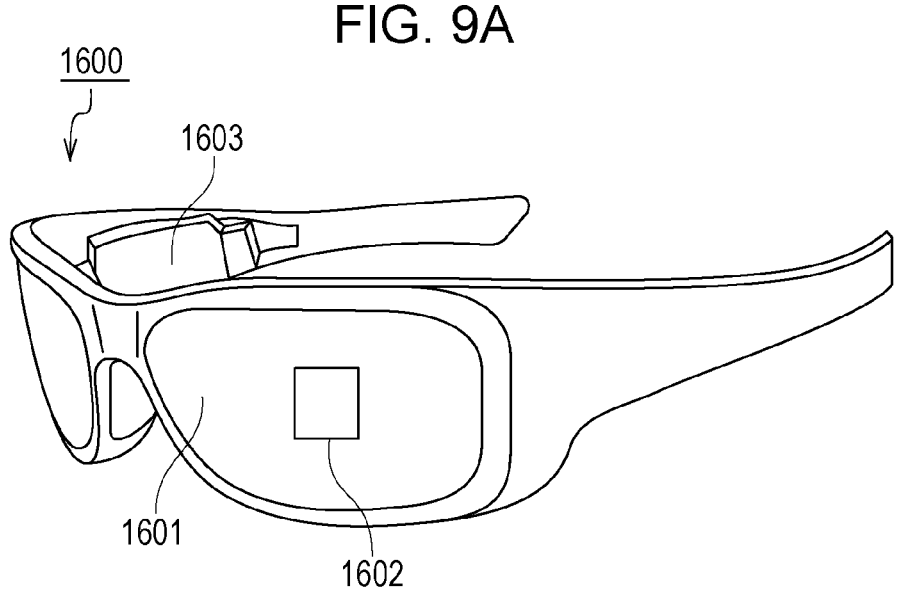
FIG. 9A is a schematic view illustrating a non-limiting example of a wearable device according to at least one embodiment of the present disclosure.

FIG. 9A illustrates glasses 1600 (smart glasses) according to an example of applications. An imaging apparatus 1602 such as a complementary metal-oxide semiconductor (CMOS) sensor or a single-photon avalanche diode (SPAD) is provided on the front side of a lens 1601 of the glasses 1600. The display apparatus according to any of the above-described embodiments is provided on the back side of the lens 1601.

The glasses 1600 further include a control unit 1603. The control unit 1603 functions as a power supply that supplies electric power to the imaging apparatus 1602 and the display apparatus according to the embodiment. The control unit 1603 controls the operation of the imaging apparatus 1602 and the display apparatus. An optical system for focusing light on the imaging apparatus 1602 is formed on the lens 1601.

Figure 9B:
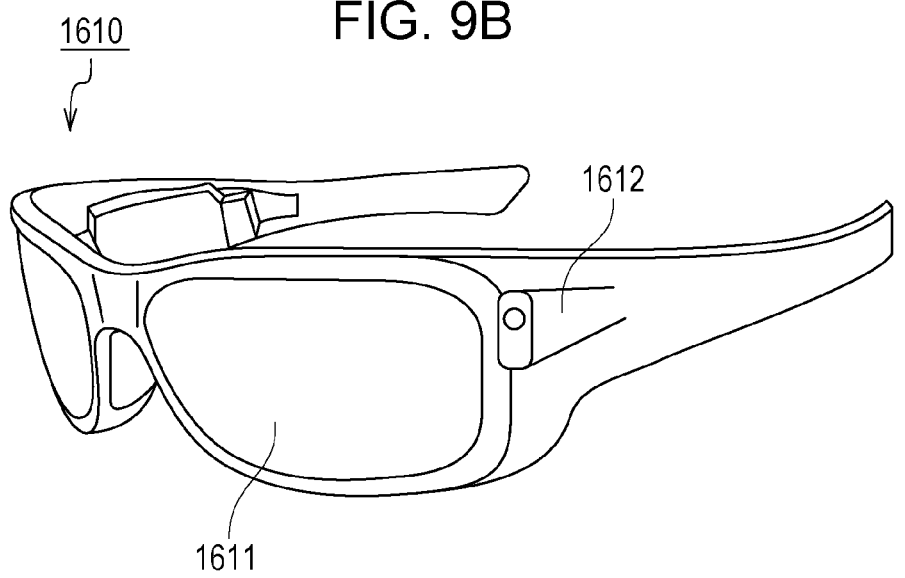
FIG. 9B is a schematic view illustrating a form including an imaging apparatus, which is a non-limiting example of a wearable device according to at least one embodiment of the present disclosure.

FIG. 9B illustrates glasses 1610 (smart glasses) according to an example of applications. The glasses 1610 have a control unit 1612. The control unit 1612 includes an imaging apparatus corresponding to the imaging apparatus 1602 and a display apparatus. An optical system for projecting light emitted from the imaging apparatus and the display apparatus in the control unit 1612 is formed on a lens 1611, and an image is projected on the lens 1611. The control unit 1612 functions as a power supply that supplies electric power to the imaging apparatus and the display apparatus and controls the operation of the imaging apparatus and the display apparatus. The control unit may have a gaze detection unit that detects the gaze of the wearer. Infrared rays may be used to detect the gaze. An infrared light-emitting unit emits infrared light to an eyeball of the user who is gazing at a displayed image. The emitted infrared light is reflected by the eyeball, and the reflected light is detected by an imaging unit including a light-receiving device to provide a captured image of the eyeball. The deterioration of the image quality is reduced by providing a reducing unit that reduces light from the infrared light-emitting unit to a display unit in plan view.

The gaze of the user to the displayed image is detected from the captured image of the eyeball captured with the infrared light. Any publicly known method is applicable to the gaze detection using the captured image of the eyeball. As an example, a gaze detection method based on the Purkinje image formed by the reflection of irradiation light on the cornea can be employed.

More specifically, a gaze detection process based on a pupil-corneal reflection method is performed. The pupil-corneal reflection method is used, on the basis of the image of the pupil and the Purkinje image included in the captured image of the eyeball, to calculate a gaze vector representing the direction (rotation angle) of the eyeball, thereby detecting the gaze of the user.

A display apparatus according to an embodiment of the present disclosure may include an imaging apparatus having a light-receiving device, and may control a displayed image of the display apparatus on the basis of the gaze information of the user from the imaging apparatus.

Specifically, in the display apparatus, a first field-of-view region at which the user gazes and a second field-of-view region other than the first field-of-view region are determined on the basis of the gaze information. The first field-of-view region and the second field-of-view region may be determined by the control unit of the display apparatus or may be determined by receiving those determined by an external control unit. In the display region of the display apparatus, the display resolution of the first field-of-view region may be controlled to be higher than the display resolution of the second field-of-view region. That is, the resolution of the second field-of-view region may be controlled to be lower than that of the first field-of-view region.

The display region includes a first display region and a second display region different from the first display region. An area of higher priority is determined from the first display region and the second display region on the basis of the gaze information. The first display region and the second display region may be determined by the control unit of the display apparatus or may be determined by receiving those determined by an external control unit. The resolution of an area of higher priority may be controlled to be higher than the resolution of an area other than the area of higher priority. That is, the resolution of an area of a relatively low priority may be controlled to be low.

The first field-of-view region or the area of higher priority may be determined by artificial intelligence (AI). The AI may be a model configured to estimate the angle of the gaze and the distance to a target object located in the gaze direction from images of the eyeball by using, as teaching data, images of the eyeball and the actual gaze direction of the eyeball in the images. The AI program may be stored in the display apparatus, the imaging apparatus, or an external apparatus. When the AI program is stored in the external apparatus, the AI program is transmitted through communication to the display apparatus.

In the case of controlling the display on the basis of visual recognition detection, smart glasses further including an imaging apparatus that captures an external image can be applied. The smart glasses can display the captured external information in real time.

As described above, the use of an apparatus that uses the organic light-emitting device according to the present embodiment can achieve a stable display with good image quality even for a long time.

According to the present disclosure, reducing the component contained in the developing solution enables the organic light-emitting device with high reliability to be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-146899, filed Sep. 9, 2021, which is hereby incorporated by reference herein in its entirety.

What is claimed is:

1. An organic light-emitting device comprising:
an insulating layer;
a first organic light-emitting element and a second organic light-emitting element that are disposed on the main surface of the insulating layer;
a color filter layer including a first color filter that is superposed on the first organic light-emitting element in plan view and that passes light with a first wavelength and a second color filter that is superposed on the second organic light-emitting element and that passes light with a second wavelength different from the first wavelength, and
a resin layer disposed on the first color filter and the second color filter;
wherein the resin layer is disposed between the first color filter and the second color filter;
wherein each of the first color filter and the second color filter has a first surface facing each of the first organic light-emitting element and the second organic light-emitting element, respectively and a second surface opposite to the first surface,
a difference between the distance from the first surface of the first color filter to the insulating layer in the direction perpendicular to the main surface of the insulating layer and the distance from the first surface of the second color filter to the insulating layer in the direction perpendicular to the main surface of the insulating layer is smaller than a difference between the distance from the second surface of the first color filter to the insulating layer in the direction perpendicular to the main surface of the insulating layer and the distance from the second surface of the second color filter to the insulating layer in the direction perpendicular to the main surface of the insulating layer, and the concentration of an organic alkali having a nitrogen atom and a hydroxy group contained in the color filter layer is less than 108.2 ng/cm$^2$.

2. The organic light-emitting device according to claim 1, wherein the organic alkali is tetramethylammonium hydroxide.

3. The organic light-emitting device according to claim 1, wherein the concentration of the organic alkali is 40 ng/cm$^2$ or less.

4. The organic light-emitting device according to claim 1, wherein the concentration of the organic alkali is 10 ng/cm$^2$ or less.

5. The organic light-emitting device according to claim 1, wherein the concentration of the organic alkali is more than 0 ng/cm$^2$.

6. The organic light-emitting device according to claim 1, wherein the concentration of the organic alkali is 0.08 ng/cm$^2$ or more.

7. The organic light-emitting device according to claim 1, wherein the color filter layer is composed of a resin curable at 100° C. or lower.

8. The organic light-emitting device according to claim 1, wherein an organic layer included in the first organic light-emitting element is composed of an organic compound having a glass transition temperature of 100° C. or higher.

9. The organic light-emitting device according to claim 1, further comprising a lens for condensing light emitted from the first organic light-emitting element, wherein the lens is disposed facing the second surface of the first color filter.

10. The organic light-emitting device according to claim 9, comprising a protective member on the lens with a hollow structure interposed therebetween.

11. The organic light-emitting device according to claim 1, comprising a moisture-permeable protective layer between the first organic light-emitting element and the color filter layer.

12. The organic light-emitting device according to claim 1, further comprising a third color filter that passes light with a third wavelength different from the first wavelength and the second wavelength, wherein the resin layer is disposed on the third color filter, and the resin layer is disposed between the first color filter and the third color filter.

13. The organic light-emitting device according to claim 12, wherein the first color filter, the second color filter, and the third color filter are arranged in a delta arrangement.

14. A display apparatus comprising a plurality of pixels, wherein at least one of the plurality of pixels includes the organic light-emitting device according to claim 1 and a transistor connected to the organic light-emitting device.

15. An imaging apparatus comprising:

an optical portion including a plurality of lenses;

an imaging element for receiving light passed through the optical portion, and a display portion for displaying an image imaged by the imaging element, wherein the display portion includes the organic light-emitting device according to claim 1.

16. An electronic apparatus comprising:

a display portion including the organic light-emitting device according to claim 1;

a housing provided with the display portion; and a communication portion that is disposed in the housing and that communicates with the outside.

* * * * *